US010127979B2

(12) United States Patent
Apodaca et al.

(10) Patent No.: US 10,127,979 B2
(45) Date of Patent: Nov. 13, 2018

(54) MEMORY CELL LOCATED PULSE GENERATOR

(71) Applicant: Western Digital Technologies, Inc., Irvine, CA (US)

(72) Inventors: Mac D. Apodaca, San Jose, CA (US); Daniel Robert Shepard, Hampton, NH (US)

(73) Assignee: Western Digital Technologies, Inc., San Jose, UT (US)

( * ) Notice: Subject to any disclaimer, the term of this patent is extended or adjusted under 35 U.S.C. 154(b) by 0 days.

(21) Appl. No.: 15/068,213

(22) Filed: Mar. 11, 2016

(65) Prior Publication Data

US 2017/0263314 A1    Sep. 14, 2017

(51) Int. Cl.
| | | |
|---|---|---|
| *G11C 11/00* | (2006.01) | |
| *G11C 13/00* | (2006.01) | |
| *H01L 23/528* | (2006.01) | |
| *H01L 27/24* | (2006.01) | |
| *H01L 45/00* | (2006.01) | |
| *H01L 27/22* | (2006.01) | |

(Continued)

(52) U.S. Cl.
CPC ...... *G11C 13/0069* (2013.01); *G11C 11/1675* (2013.01); *G11C 13/0004* (2013.01); *H01L 23/528* (2013.01); *H01L 27/228* (2013.01); *H01L 27/2436* (2013.01); *H01L 27/2463* (2013.01); *H01L 45/1233* (2013.01); *G11C 2013/0078* (2013.01); *H01L 43/08* (2013.01); *H01L 45/06* (2013.01)

(58) Field of Classification Search
CPC ............ G11C 13/0069; G11C 13/0004; G11C 11/1675; G11C 2013/0078; H01L 27/228; H01L 43/08; H01L 43/02; H01L 45/06; H01L 27/2463; H01L 45/1233; H01L 27/2436; H01L 23/528
See application file for complete search history.

(56) References Cited

U.S. PATENT DOCUMENTS

| | | |
|---|---|---|
| 5,197,030 A | 3/1993 | Akaogi et al. |
| 5,386,150 A | 1/1995 | Yonemoto |

(Continued)

OTHER PUBLICATIONS

Hybrid Crossbar Architecture for a Memristor Based Memory <http://arxiv.org/ftp/arxiv/papers/1302/1302.6515.pdf>.

(Continued)

*Primary Examiner* — Mohammed A Bashar
(74) *Attorney, Agent, or Firm* — Stoel Rives LLP

(57) ABSTRACT

The present disclosure generally relates to a memory cell and methods for generating a pulse within the memory cell. As such, a geometric arrangement of transistors is disclosed that allows the transistor pulse signal generator circuit to precharge both sides of the memory cell and, subsequently, bring opposite sides of the memory cell quickly to different voltages. The circuit and wiring fabrication provided, when combined with a related transistor manufacturing process, yields pulse generating logic at the memory cell to enable the formation of a well-defined pulse while fitting within the $4F^2$ footprint of the memory cell. As such, the speed and pulse shape requirements of PCM, MRAM, other such cross-point memory technologies, sensor arrays, and/or pixel displays may take advantage of the reduced RC circuitry delays.

20 Claims, 5 Drawing Sheets

(51) Int. Cl.
  *G11C 11/16* (2006.01)
  *H01L 43/08* (2006.01)

(56) References Cited

U.S. PATENT DOCUMENTS

| | | | |
|---|---|---|---|
| 5,712,824 | A | 1/1998 | Uchihira |
| 6,018,176 | A | 1/2000 | Lim |
| 6,229,746 | B1 | 5/2001 | Tooher |
| 6,256,224 | B1 | 7/2001 | Perner et al. |
| 6,400,612 | B1 | 6/2002 | Patti |
| 6,963,518 | B2 | 11/2005 | Sasaki et al. |
| 7,005,350 | B2 | 2/2006 | Walker et al. |
| 7,489,589 | B2 | 2/2009 | Chen et al. |
| 7,505,326 | B2 | 3/2009 | Sivero et al. |
| 8,059,454 | B2 | 11/2011 | Li et al. |
| 8,084,807 | B2 | 12/2011 | Ishiduki et al. |
| 8,404,536 | B2 | 3/2013 | Mouli |
| 2004/0005755 | A1 | 1/2004 | Moniwa et al. |
| 2004/0027907 | A1* | 2/2004 | Ooishi ............... G11C 11/15 365/226 |
| 2005/0148173 | A1 | 7/2005 | Shone |
| 2008/0029811 | A1 | 2/2008 | Yun et al. |
| 2014/0087534 | A1 | 3/2014 | Choe et al. |
| 2014/0269008 | A1* | 9/2014 | Baker, Jr. ........... G11C 13/0002 365/148 |
| 2015/0138880 | A1* | 5/2015 | Russo .................... H01L 45/06 365/163 |
| 2015/0179230 | A1 | 6/2015 | Zhang |
| 2017/0279043 | A1 | 9/2017 | Apodaca et al. |

OTHER PUBLICATIONS

Method of Fabrication of Strained-SiGe Vertical Transistor, <https://priorart.ip.com/IPCOM/000237153> IP.com Jun. 5, 2014.

Apodaca, et al., Office Action dated Feb. 7, 2018 for U.S. Appl. No. 15/080,477.

Apodaca, et al., Office Action dated Jul. 3, 2017 for U.S. Appl. No. 15/080,477.

\* cited by examiner

MEMORY CELL LOCATED PULSE GENERATOR

BACKGROUND OF THE DISCLOSURE

Field of the Disclosure

Embodiments of the present disclosure generally relate to data storage and computer memory systems, and more particularly to a pulse generator located within a memory cell.

Description of the Related Art

Cross-point arrays are desirable for their compact structure which enables high density; however, cross-point arrays suffer from the problem of parasitics which includes resistance and capacitance of the rows and columns. The resistance results in voltage drops along the rows and columns thereby requiring greater voltages to provide the current necessary, and the capacitance results in RC time delays that degrade pulse shapes and slow performance.

Certain types of memory cell technologies require specific pulse shapes in order to perform well (e.g., PCM) or to perform at all (e.g., MRAM using MTJ, SHE, and VCMA). When utilizing PCM, the pulse to program is switched off rapidly to ensure the chalcogenide alloy in the cell is trapped in its amorphous state. When the pulse edge is slow, a great variance exists in the resulting resistance that makes state sensing less reliable, especially in larger arrays. In the case of MRAM, the VCMA pulse is narrow (e.g., 700 pSec+/−250 pSec for operation) to achieve processional switching; however such a narrow pulse is not possible for any cross-point array of any size due to the inherent RC time constant of the highly resistive, 1F wide column and row line wiring combined with the cross-coupled capacitance of the closely packed (1F spacing) row and column lines. Furthermore MRAM memory cells need a very short write pulse signal, and for low currents it is beneficial to have a pulse signal generator physically close to the memory cell.

Therefore, what is needed in the art is a transistor pulse signal generator circuit that precharges both sides of a memory cell and subsequently discharges opposite sides of the memory cell quickly to different voltages.

SUMMARY OF THE DISCLOSURE

The present disclosure generally relates to a memory cell and methods for generating a pulse within the memory cell. As such, a geometric arrangement of transistors is disclosed that allows the transistor pulse signal generator circuit to precharge both sides of the memory cell and, subsequently, bring opposite sides of the memory cell quickly to different voltages. The circuit and wiring fabrication provided, when combined with a related transistor manufacturing process, yields pulse generating logic at the memory cell to enable the formation of a well-defined pulse while fitting within the $4F^2$ footprint of the memory cell. As such, the speed and pulse shape requirements of PCM, MRAM, other such cross-point memory technologies, sensor arrays, and/or pixel displays may take advantage of the reduced RC circuitry delays.

In one embodiment, a memory device is disclosed. The memory device includes a bit line, a word line, and a memory cell coupled between the bit line and the word line. The memory device further includes a first transistor having a first source electrode, a first drain electrode, and a first gate electrode, and a second transistor having a second source electrode, a second drain electrode, and a second gate electrode. The memory device also includes a third transistor having a third source electrode, a third drain electrode, and a third gate electrode, and a fourth transistor having a fourth source electrode, a fourth drain electrode, and a fourth gate electrode. The first gate electrode is coupled to the second gate electrode, and the first source electrode is coupled to a first voltage source. The second source electrode is coupled to a second voltage source, and the first drain electrode is coupled to the word line.

In another embodiment, a memory array is disclosed. The memory array includes a plurality of memory devices. Each memory device includes a bit line, a word line, and a memory cell coupled between the bit line and the word line. Each memory device further includes a first transistor having a first source electrode, a first drain electrode, and a first gate electrode, and a second transistor having a second source electrode, a second drain electrode, and a second gate electrode. Each memory device also includes a third transistor having a third source electrode, a third drain electrode, and a third gate electrode, and a fourth transistor having a fourth source electrode, a fourth drain electrode, and a fourth gate electrode. The first gate electrode is coupled to the second gate electrode, and the first source electrode is coupled to a first voltage source. The second source electrode is coupled to a second voltage source, and the first drain electrode is coupled to the word line. Furthermore, the third transistor of the first memory device is coupled to the fourth transistor of the second memory device.

In another embodiment, a method for generating a pulse within a $4F^2$ footprint of a memory cell is disclosed. The method includes creating a zero potential across the memory cell, shifting a first end and a second end of the memory cell to a first voltage, and shifting the first end and the second end of the memory cell to a predetermined second voltage, wherein the predetermined second voltage is approximately equal to an amplitude of the pulse. The method further includes discharging the first end of the memory cell to the first voltage, and discharging the second end of the memory cell to the first voltage, wherein the discharging of the second end of the memory cell is delayed behind the discharging of the first end of the memory cell.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a memory cell and methods for generating a pulse within the memory cell. As such, a geometric arrangement of transistors is disclosed that allows the transistor pulse signal generator circuit to precharge both sides of the memory cell and, subsequently, bring opposite sides of the memory cell quickly to different voltages. The circuit and wiring fabrication provided, when combined with a related transistor manufacturing process, yields pulse generating logic at the memory cell to enable the formation of a well-defined pulse while fitting within the $4F^2$ footprint of the memory cell. As such, the speed and pulse shape requirements of PCM, MRAM, other such cross-point memory technologies, sensor arrays, and/or pixel displays may take advantage of the reduced RC circuitry delays.

Figure 1:
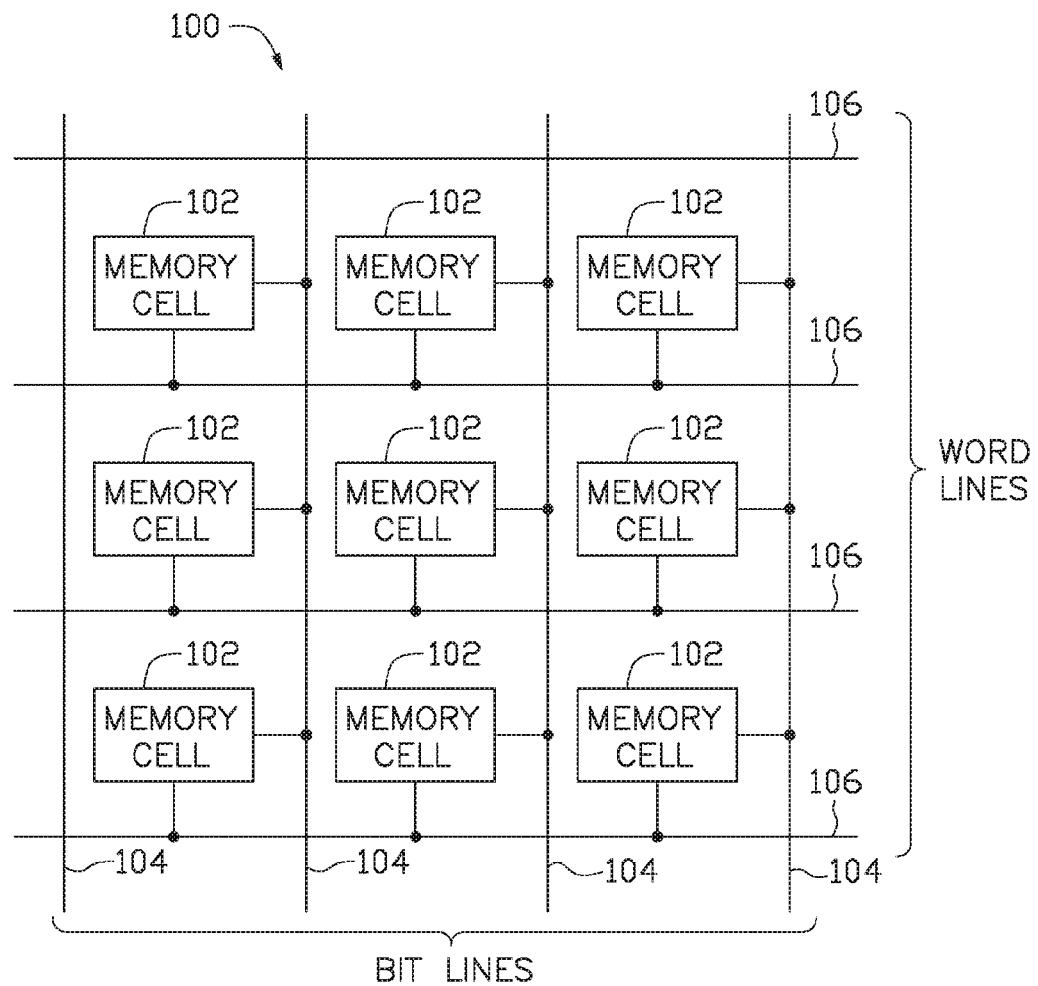
FIG. 1 is a schematic diagram of a memory array, according to one embodiment described herein.

FIG. 1 is a schematic diagram of a memory array 100, according to one embodiment described herein. The memory array 100 includes a plurality of memory cells 102, a first plurality of parallel lines 104, and a second plurality of parallel lines 106. The first plurality of parallel lines 104 run orthogonal to the second plurality of parallel lines 106. The first plurality of parallel lines 104 represent bit lines. The second plurality of parallel lines 106 represent word lines. Each memory cell 102 is coupled to a bit line 104 and a word line 106. Co-linear memory cells 102 are coupled to one common line and one line not in common with the other co-linear memory cells.

Figure 2:
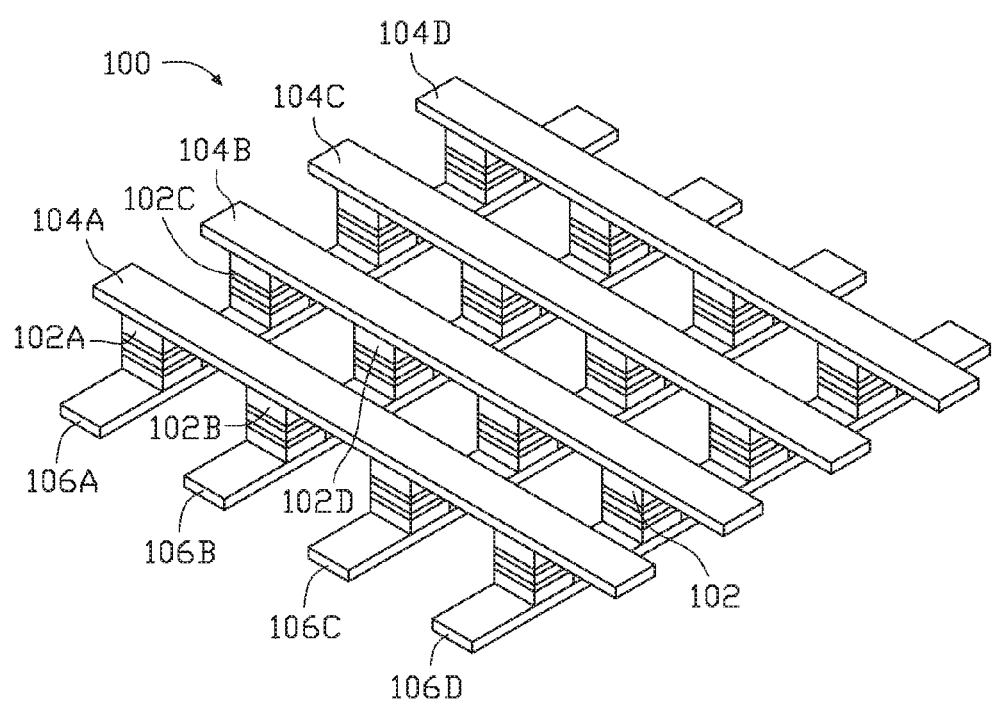
FIG. 2 is a schematic perspective view of the memory array of FIG. 1, according to one embodiment described herein.

FIG. 2 is a schematic perspective view of the above described memory array 100, according to one embodiment described herein. The first plurality of parallel lines 104 are disposed in a common plane. The second plurality of parallel lines 106 are disposed in a common plane spaced above the first plurality of parallel lines 104. The memory array 100 is arranged such that a first memory cell 102A is coupled to a first line 104A of the first plurality of parallel lines 104 and a first line 106A of the second plurality of parallel lines 106. A second memory cell 102B is also coupled to the first line 104A and a second line 106B of the second plurality of parallel lines 106. A third memory cell 102C is coupled to a second line 104B of the first plurality of parallel lines 104. The third memory cell 102C is also coupled to the first line 106A. A fourth memory cell 102D is coupled to both the second line 104B and the second line 106B. It is to be understood that while four lines 104A-104D of the first plurality of lines 104 are shown, more or less lines are contemplated. Furthermore, it is also to be understood that while four lines 106A-106D of the second plurality of lines 106 are shown, more or less lines are contemplated.

Figure 3:
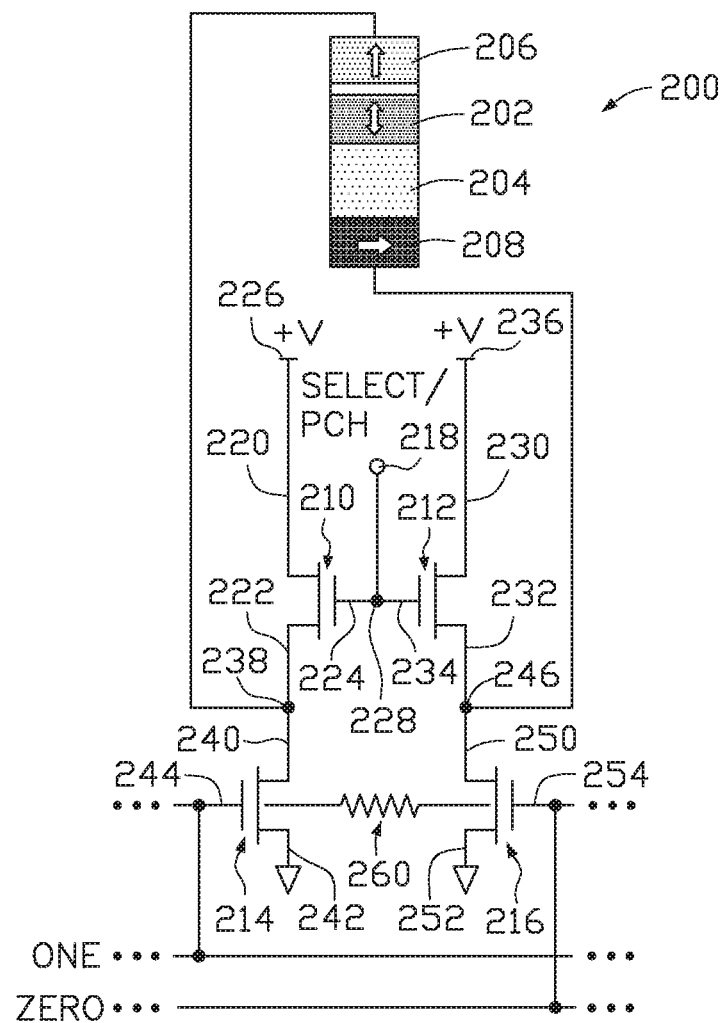
FIG. 3 is a schematic diagram of a memory device comprising transistors in a pulse generator circuit, according to one embodiment.

FIG. 3 is a schematic diagram of a memory device 200, according to one embodiment. The memory device 200 includes memory cell 202 coupled between a bit line 204 and a word line 206. Memory cell 202 is substantially similar to the memory cell 102 described supra, and may comprise the same properties. In some embodiments, the memory device 200 may include a second bit line 208. The second bit line 208 may be coupled to the bit line 204. Each of the bit line 204, the second bit line 208, and/or the word line 206 may comprise an electrode. The bit line 204 and word line 106 are each substantially similar to the first plurality of parallel lines 104 and the second plurality of parallel lines 106, respectively, as described supra with respect to FIG. 1 and FIG. 2.

The memory device 200 further includes a plurality of transistors, and as shown in the embodiment of FIG. 3, the memory device 200 includes a first transistor 210, a second transistor 212, a third transistor 214, and a fourth transistor 216. Each of the first transistor 210, the second transistor 212, the third transistor 214, and the fourth transistor 216 may be a field-effect transistor (FET) which uses an electric field to control the shape and hence the electrical conductivity of the a channel of one type of charge carrier in a semiconductor material.

Each of the first transistor 210, the second transistor 212, the third transistor 214, and the fourth transistor 216 includes at least three terminals: a source electrode, a drain electrode, and a gate electrode. The source electrode is the terminal through which carriers enter the channel. The drain electrode is the terminal through which carriers leave the channel. The gate electrode is the terminal that modulates the channel conductivity.

The first transistor 210 includes a first source electrode 220, a first drain electrode 222, and a first gate electrode 224. The first source electrode 220 is coupled to a first voltage source 226. The first drain electrode 222 is further coupled to the word line 206. The second transistor 212 includes a second source electrode 230, a second drain electrode 232, and a second gate electrode 234. The second source electrode 230 is coupled to a second voltage source 236. The second drain electrode 232 is further coupled to the bit line 204. In some embodiments, the second drain electrode 232 is coupled to the second bit line 208. The first gate electrode 224 is coupled to the second gate electrode 234 at a first common node 228. The first common node 228 may further be coupled to a select pre-charge 218, wherein the select pre-charge 218 precharges the plurality of transistors. As such, the select pre-charge 218 is coupled to the first gate electrode 224 and the second gate electrode 234.

The third transistor 214 includes a third source electrode 240, a third drain electrode 242, and a third gate electrode 244. The fourth transistor 216 includes a fourth source electrode 250, a fourth drain electrode 252, and a fourth gate electrode 254.

As further shown in FIG. 3, the first drain electrode 222 is coupled to third source electrode 240 at a second common node 238. The second drain electrode 232 is coupled to the fourth source electrode 250 at a third common node 246. A resistor 260 is coupled between the third transistor 214 and the fourth transistor 216.

In some embodiments, the first transistor 210 and the second transistor 212 drive the current, while the third transistor 214 and the fourth transistor 216 select the polarity of the pulse. The two current driving transistors for each memory cell 202 may share the same gate signal. Furthermore, the two polarity driving transistors for each memory cell 202 may have gates attached to first and second programming signals. It is contemplated that in some embodiments different combinations of at least two transistors may drive the current, while a different combination of two other transistors select the plurality of the pulse.

The memory cell 202 and surrounding space of the memory device 200 of FIG. 3 has a size of $4F^2$, where F is the minimum lithographic feature of the densest process layer.

Figure 4:
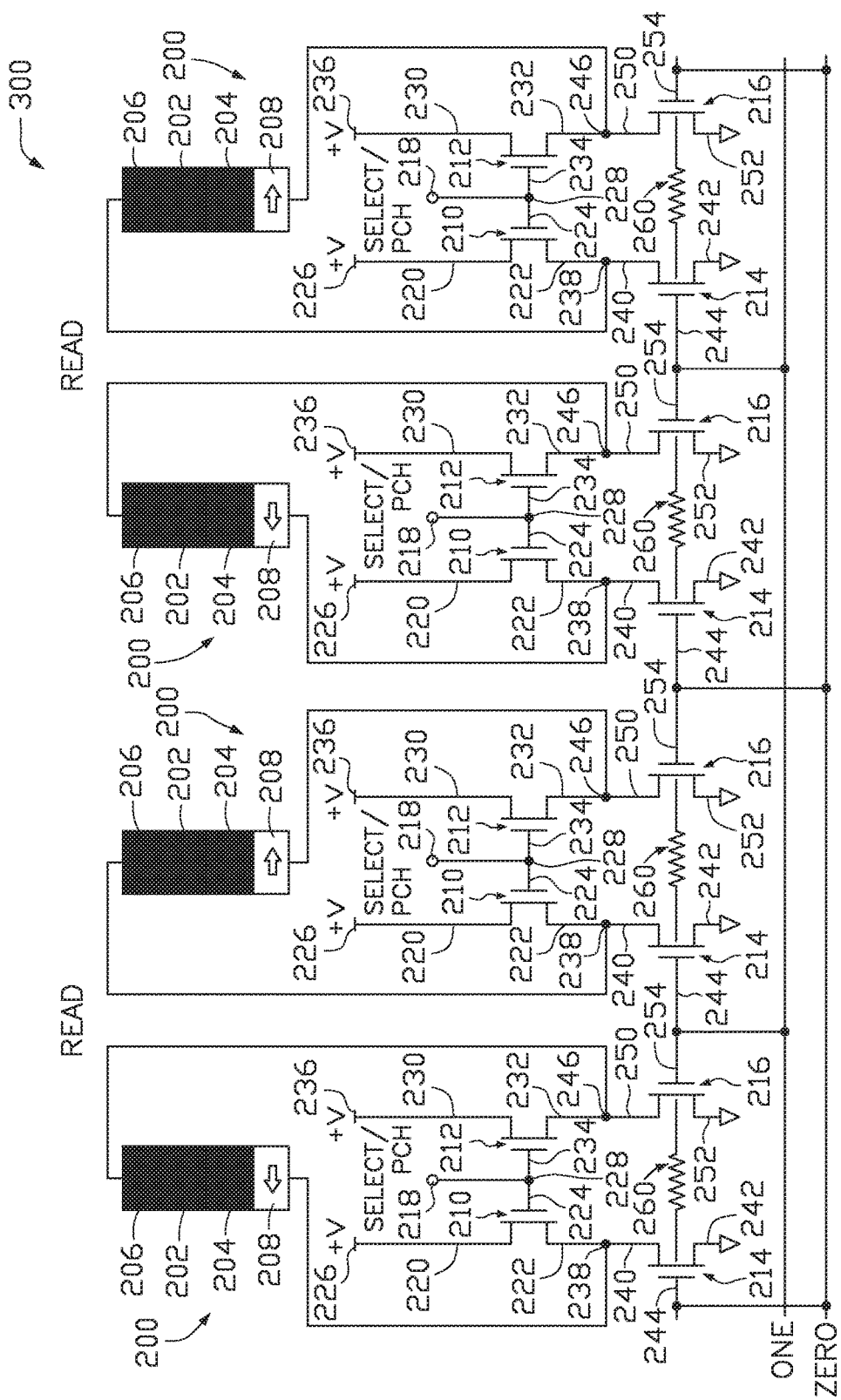
FIG. 4 is a schematic diagram of a memory array of a plurality of memory devices each comprising transistors in a pulse generator circuit, according to one embodiment.

FIG. 4 is a schematic diagram of a memory array 300, according to one embodiment. The memory array 300 includes a plurality of memory devices, such as the memory device 200 as described in FIG. 3. The third transistor 214 of each memory device 200 of the memory array 300 is coupled to the fourth transistor 216 of a second memory device 200.

With reference to both FIG. 3 and FIG. 4, an amount of logic at each memory cell 200 is located to enable the formation of a defined pulse while fitting within the $4F^2$ footprint of the memory cell 200. As such, the speed and pulse shape requirements of PCM, MRAM, and other such cross-point technologies may be met.

While $4F^2$ is a typical limit for cross-point memories, it is contemplated that the memory cell footprint may also be larger or smaller than $4F^2$ in certain embodiments of the present disclosure. In some embodiments, the space between the memory cells may be smaller than 1F, thus less than $4F^2$. In other embodiments, for example, in most MRAM devices, the space between the memory cells may be larger than $12F^2$, and thus greater than $4F^2$. If the memory cell stores two or more bits per cell, the area is generally divided by the number of bits in order to calculate the effective footprint of a memory cell. As such, each memory cell 200 of the present disclosure may have a sub-lithographic footprint (i.e., a footprint smaller than less than $4F^2$), a $4F^2$ footprint, or a footprint greater than $4F^2$. The amount of logic located at each memory cell 200 may be located to enable the formation of the defined pulse while fitting within a footprint of greater than, less than, or equal to $4F^2$.

Figure 5:
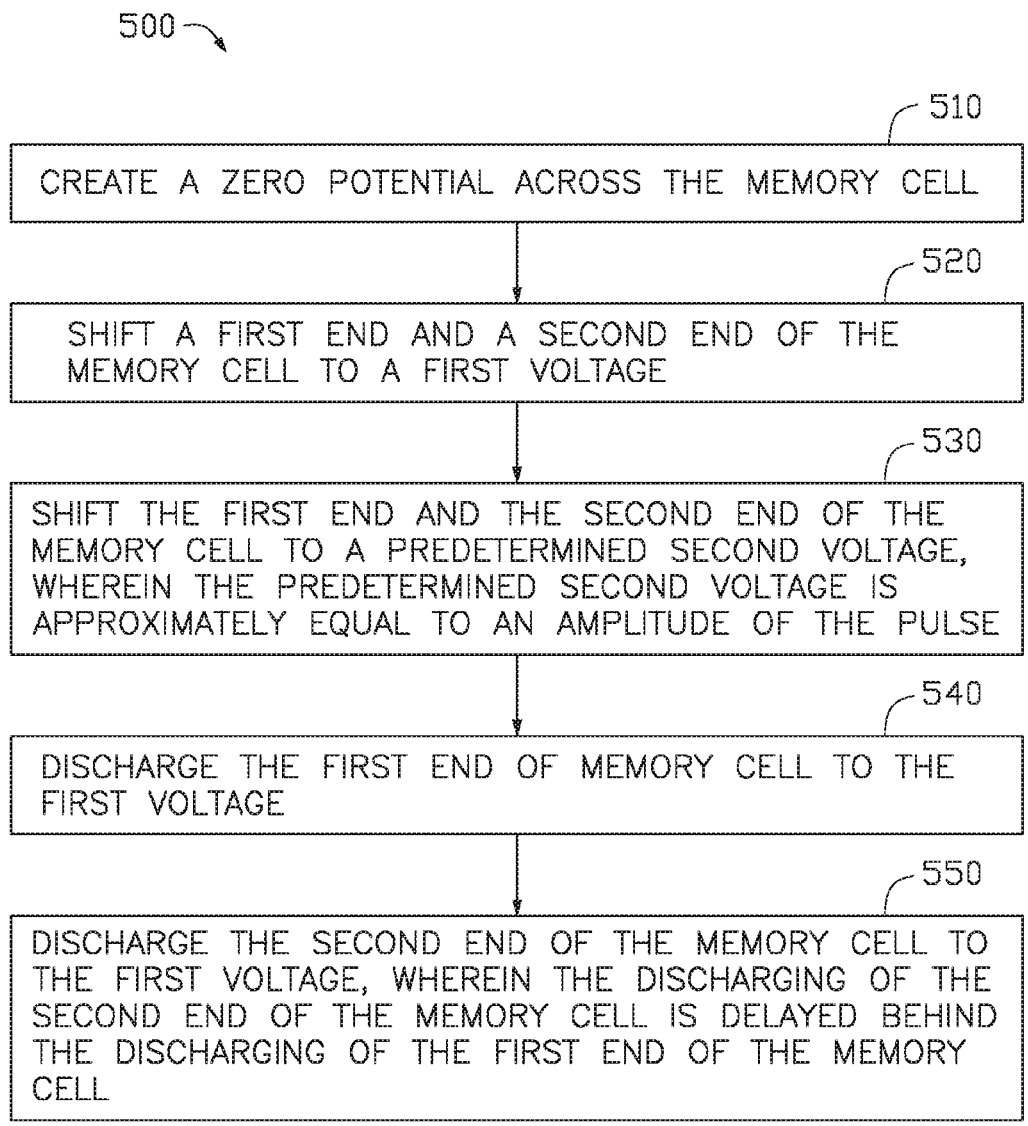
FIG. 5 is a schematic flow diagram of a method for generating a pulse within a $4F^2$ footprint of a memory cell, according to one embodiment.

FIG. 5 is a schematic flow diagram of a method 500 for generating a pulse within a $4F^2$ footprint of a memory cell, according to one embodiment. The memory cell and surrounding space has a size of $4F^2$, where F is the minimum lithographic feature of the densest process layer.

With respect to FIG. 5, it is further contemplated that, in some embodiments, the memory cell may have a footprint of greater than or less than $4F^2$, as discussed supra.

At operation 510, a zero potential is created across the memory cell. Within the pulser circuit of each memory cell and/or the memory array, each of the first end and the second end are grounded. In some embodiments, grounding may be forced by bringing each of the first end and the second end to high, and subsequently bringing each of the first end and the second end to low. By starting each of the first end and the second end at a neutral voltage (ground) the select pre-charge signal is activated. By activating the select pre-charge signal each of the first gate electrode and the second gate electrode become activated which places that the same voltage (+V) on both the first end and the second end of the cell, as described infra.

At operation 520, a first end of the memory cell and a second end of the memory cell are each shifted to a first voltage. The shifting may occur in parallel. As such, the same voltage (+V) is applied to both sides of the memory cell. In certain embodiments, the voltage (+V) that each of the first end and the second end is raised to is the amplitude of the pulse. In some embodiments, pre-charging the first end to a positive voltage may also bring the second end to a positive voltage.

At operation 530, the first end of the memory cell and the second end of the memory cell are each shifted to a predetermined second voltage. The predetermined second voltage is approximately equal to an amplitude of the pulse.

At operation 540, the first end of the memory cell is discharged to the first voltage. By selecting One or Zero, the first end is triggered to return to ground. As such, the second end follows and also returns to ground, as described infra.

At operation 550, the second end of the memory cell is discharged to the first voltage. The discharging of the second end of the memory cell is delayed behind the discharging of the first end of the memory cell, as described with respect to operation 540. Once both sides of the MTJ have discharged, Zero or One is brought back to low. The ΔV across the MTJ is a narrow pulse with a polarity as a function of the Zero or One.

In the transition of discharging the first end and the second to ground, the first end is returned to ground before the second end is discharged, thus causing the delay. In the moment of the delay a potential is created across the memory cell, which allows for a writing to the cell to occur during the delay. In some embodiments, the delay causes the second end to flow through the cell, thus writing the cell. It is the removal of the voltage across the memory cell, not the application of the voltage across the memory cell, which allows for the writing of the memory cell.

In certain embodiments, the delay is equivalent to the width of the pulse. Furthermore, in some embodiments, the delay is less than about 1.0 nanoseconds, for example less than about 0.6 nanoseconds, such as less than about 0.5 nanoseconds. In some embodiments, the delay is due to an RC time constant of the resistor and/or a gate capacitance. The RC time constant sets a width of the pulse. Once both sides of the MTJ have discharged, each of the first end and the second end is brought back to low. The ΔV across the MTJ is a narrow pulse with a polarity as a function of the Zero or One.

Benefits of the present disclosure include a magnetic tunnel junction (MTJ) array, including the memory cell and the surrounding area, which is maintained within a $4F^2$ footprint, where F is the minimum lithographic feature of the densest process layer. As such, the magnetic cells disclosed can be switched extremely rapidly, for example, within picoseconds, thus creating non-volatile memory that utilizes extremely low power and is exceptionally fast.

In summation, a memory cell and methods for generating a pulse within the memory cell is disclosed. Furthermore, a geometric arrangement of transistors is disclosed that allows the transistor pulse signal generator circuit to precharge both sides of the memory cell and, subsequently, bring opposite sides of the memory cell quickly to different voltages. The circuit and wiring fabrication provided, when combined with a related transistor manufacturing process, yields pulse generating logic at the memory cell to enable the formation of a well-defined pulse while fitting within the 4F² footprint of the memory cell. As such, the speed and pulse shape requirements of PCM, MRAM, other such cross-point memory technologies, sensor arrays, and/or pixel displays may take advantage of the reduced RC circuitry delays.

While the foregoing is directed to embodiments of the present disclosure, other and further embodiments of the disclosure may be devised without departing from the basic scope thereof, and the scope thereof is determined by the claims that follow.

What is claimed is:

1. A memory device, comprising:
   a bit line;
   a word line;
   a memory cell coupled between the bit line and the word line;
   a first transistor having a first source electrode, a first drain electrode, and a first gate electrode;
   a second transistor having a second source electrode, a second drain electrode, and a second gate electrode;
   wherein the first gate electrode is coupled to the second gate electrode, the first source electrode is coupled to a first source voltage potential above a ground potential, the second source electrode is coupled to a second source voltage potential above the ground potential, and the first drain electrode and the word line are coupled to a same node.

2. The memory device of claim 1, further comprising a third transistor comprising a third source electrode coupled to the first drain electrode.

3. The memory device of claim 1, further comprising a fourth transistor comprising a fourth source electrode coupled to the second drain electrode.

4. The memory device of claim 1, further comprising:
   a third transistor comprising a third source electrode coupled to the first drain electrode;
   a fourth transistor comprising a source electrode coupled to the second drain electrode and the bit line; and
   a resistor coupled between the third transistor and the fourth transistor.

5. The memory device of claim 1, further comprising a select pre-charge coupled to the first gate electrode and the second gate electrode.

6. The memory device of claim 1, wherein the memory cell comprises a 4F² footprint.

7. A memory array, comprising:
   a plurality of memory devices, including a first memory device and a second memory device, each memory device comprising:
   a bit line;
   a word line;
   a memory cell coupled between the bit line and the word line;
   a first transistor having a first source electrode, a first drain electrode, and a first gate electrode;
   a second transistor having a second source electrode, a second drain electrode, and a second gate electrode;
   a third transistor having a third source electrode, a third drain electrode, and a third gate electrode; and
   a fourth transistor having a fourth source electrode, a fourth drain electrode, and a fourth gate electrode,
   wherein the first gate electrode is coupled to the second gate electrode, the first source electrode is coupled to a first voltage source, the second source electrode is coupled to a second voltage source, the third transistor of the first memory device is coupled to the fourth transistor of the second memory device, and the first drain electrode, the third source electrode and the word line are coupled to a common node.

8. The memory array of claim 7, wherein the first drain electrode of the first memory device is coupled to the third source electrode of the first memory device.

9. The memory array of claim 7, wherein the second drain electrode of the first memory device is coupled to the fourth source electrode of the first memory device.

10. The memory array of claim 7, wherein each memory device further comprises a resistor coupled between the third transistor and the fourth transistor.

11. The memory array of claim 7, wherein each memory device further comprises a select pre-charge coupled to the first gate electrode and the second gate electrode.

12. The memory array of claim 7, wherein each memory cell comprises a 4F² footprint.

13. A pulse generator circuit, comprising:
    a bit-line drive transistor; and
    a word-line drive transistor, wherein:
    the bit-line drive transistor is configured to drive a first current on a bit line of a memory cell and the word-line drive transistor is configured to drive a second current on a word line of the memory cell, the second current separate from the first current, and
    the bit-line drive transistor and the word-line drive transistor are activated by a same gate control signal.

14. The pulse generator circuit of claim 13, wherein a control gate of the bit-line drive transistor and a control gate of the word-line drive transistor are operatively coupled to the same gate control signal.

15. The pulse generator circuit of claim 13, wherein:
    the bit-line drive transistor comprises:
    a source electrode operatively coupled to a first source voltage potential, and
    a drain electrode operatively coupled to a bit line node, the bit line node operatively coupled to the bit line of the memory cell; and
    the word-line drive transistor comprises:
    a source electrode operatively coupled to a second source voltage potential, and
    a drain electrode operatively coupled to a word line node, the word line node operatively coupled to the word line of the memory cell.

16. The pulse generator circuit of claim 15, further comprising a bit-line control transistor, comprising:
    a source electrode operatively coupled to the bit line node, and
    a drain electrode operatively coupled to a first ground node.

17. The pulse generator circuit of claim 15, further comprising a word-line control transistor, comprising:
    a source electrode operatively coupled to the word line node, and
    a drain electrode operatively coupled to a second ground node.

18. The pulse generator circuit of claim 13, further comprising:
    a first control transistor comprising:
    a source electrode operatively coupled to the bit line of the memory cell and a drain electrode of the bit-line drive transistor,
    a drain electrode operatively coupled to ground, and
    a control gate operatively coupled to a first select line;

a second control transistor comprising:
   a source electrode operatively coupled to the word line of the memory cell and a drain electrode of the word-line drive transistor,
   a drain electrode operatively coupled to ground, and
   a control gate operatively coupled to a second select line; and
a resistor operatively coupled between the first control transistor and the second control transistor.

19. The pulse generator circuit of claim 13, wherein:
a drain electrode of the bit-line drive transistor is operatively coupled to the bit line of the memory cell and a source node of a first control transistor; and
a drain electrode of the word-line drive transistor is operatively coupled to the word line of the memory cell and a source node of a second control transistor.

20. The pulse generator circuit of claim 19, wherein:
a source node of the bit-line drive transistor is operatively coupled to a first voltage source;
a source node of the word-line drive transistor is operatively coupled to a second voltage source;
a gate electrode of the bit-line drive transistor and a gate electrode of the word-line drive transistor are operatively coupled to the same gate control signal;
drain electrodes of the first control transistor and the second control transistor are operatively coupled to ground;
a gate electrode of the first control transistor is operatively coupled to a first select line; and
a gate electrode of the second control transistor is operatively coupled to a second select line.

\* \* \* \* \*